United States Patent [19]

Kent

[11] Patent Number: 4,788,404
[45] Date of Patent: Nov. 29, 1988

[54] SELF-SOLDERING FLEXIBLE CIRCUIT CONNECTOR

[75] Inventor: Harold B. Kent, San Carlos, Calif.

[73] Assignee: Metcal, Inc., Menlo Park, Calif.

[21] Appl. No.: 746,796

[22] Filed: Jun. 20, 1985

[51] Int. Cl.⁴ .............................................. H05B 3/58
[52] U.S. Cl. .................................. 219/85 R; 219/209;
219/542; 219/549
[58] Field of Search ................ 219/85 R, 85 F, 85 A,
219/209, 210, 541, 542, 549, 528, 345, 351;
338/308, 309; 361/398, 414; 228/264, 180.1

[56] References Cited

FOREIGN PATENT DOCUMENTS

| 0006039 | 12/1979 | European Pat. Off. |
| 2438925 | 5/1980 | France . |
| 8315739 | 4/1984 | France . |
| 56161056 | 1/1985 | Japan . |
| 2134026 | 8/1984 | United Kingdom . |

OTHER PUBLICATIONS

IBM Technical Disclosure Bulletin, vol. 9, No. 11, p. 1668, Apr. 11, 1967.
Article, "Gold Based Alloys", Indium Corp. of America.

Primary Examiner—Philip H. Leung
Attorney, Agent, or Firm—Hall, Myers & Rose

[57] ABSTRACT

A flexible circuit which may be a strap or a board or the like has a plurality of conductors exposed on one surface in a predetermined array and a heater disposed on the opposed surface so as to heat the exposed conductors. The exposed conductors may have solder or the heat activated conductive bonding material applied thereto so that the flexible circuit may be directly connected to a component, a printed circuit board, a connector or the like. If a reusable bonding material, such as solder, is employed the heater may be utilized to both connect and disconnect the flexible circuit.

31 Claims, 6 Drawing Sheets

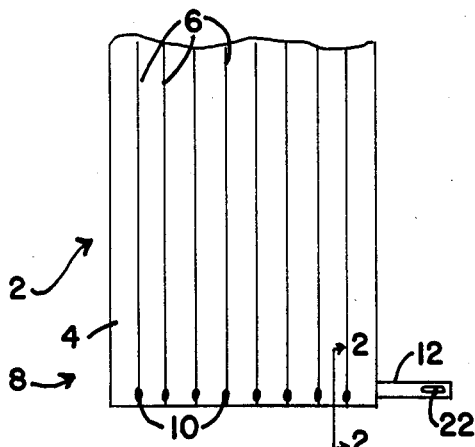
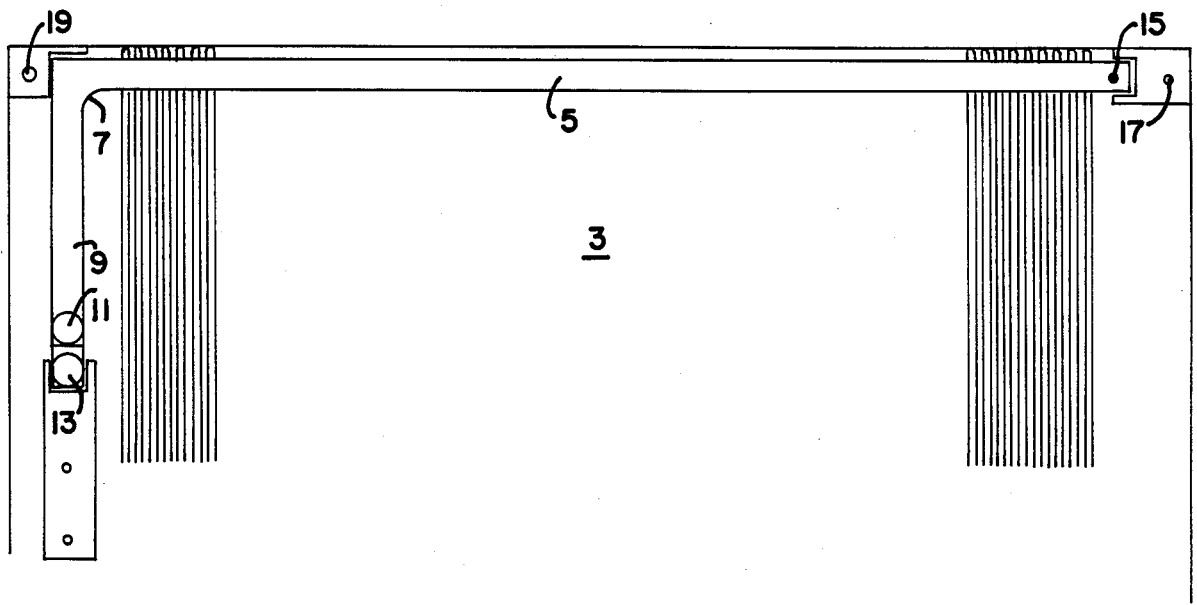
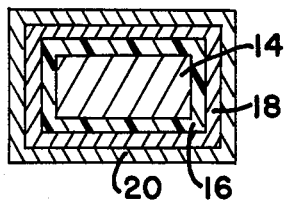
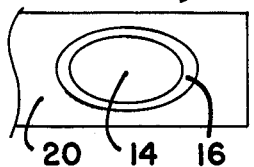
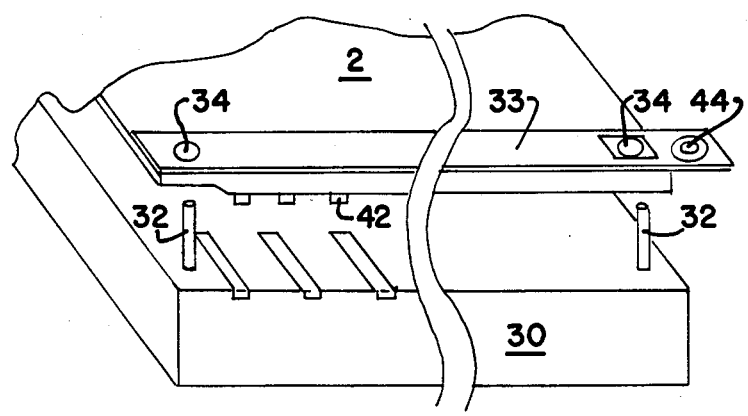

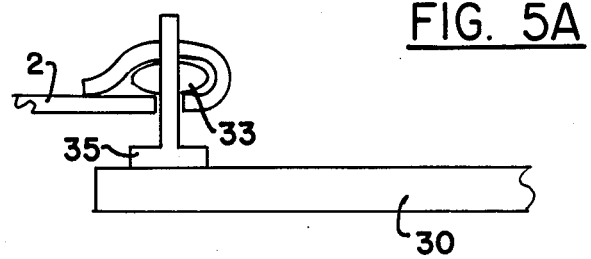
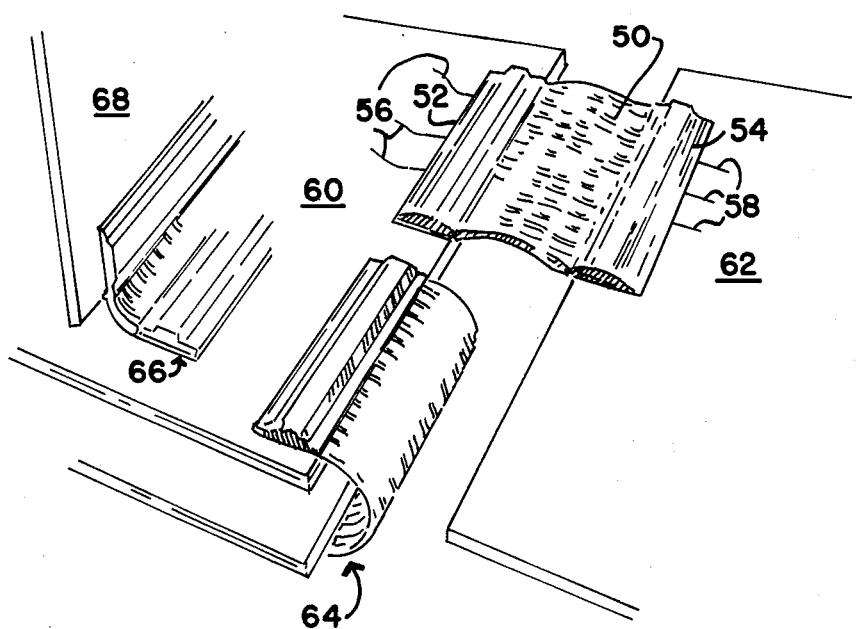
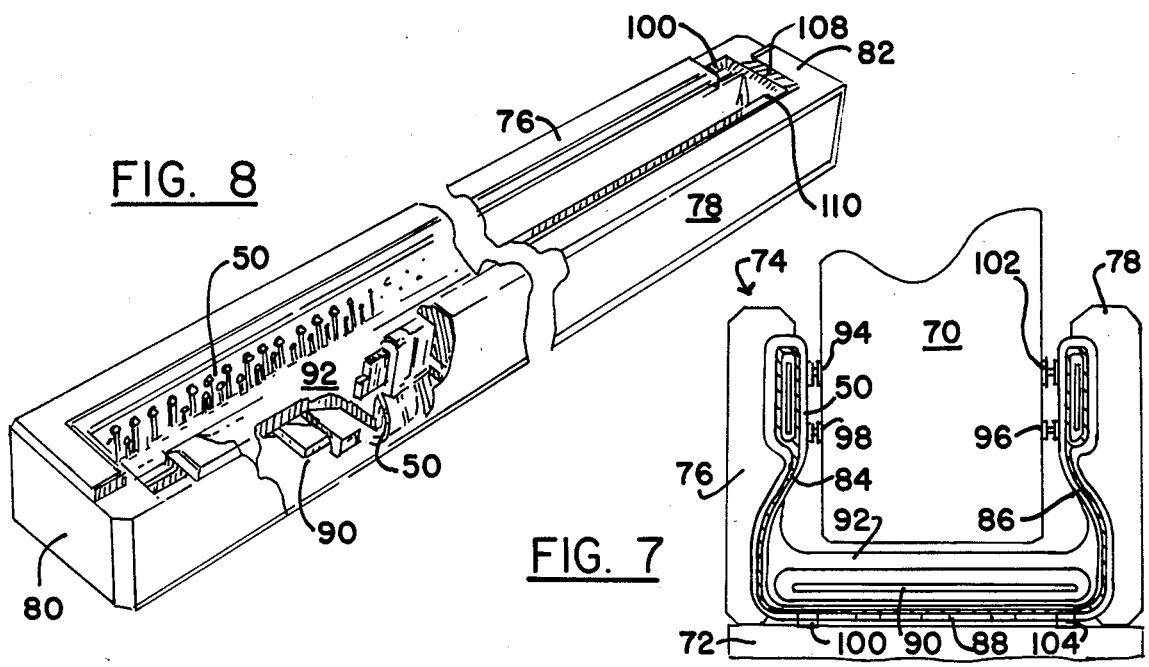

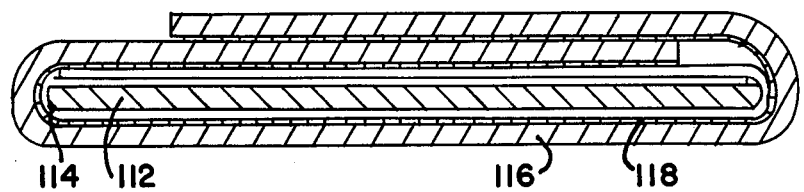
FIG. 9
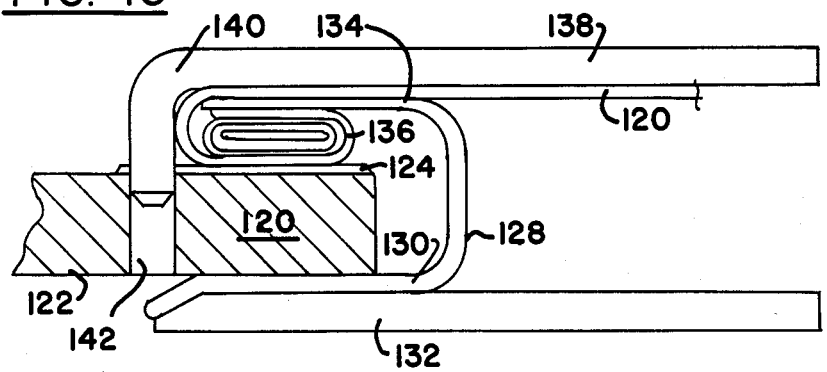
FIG. 10
FIG. 11
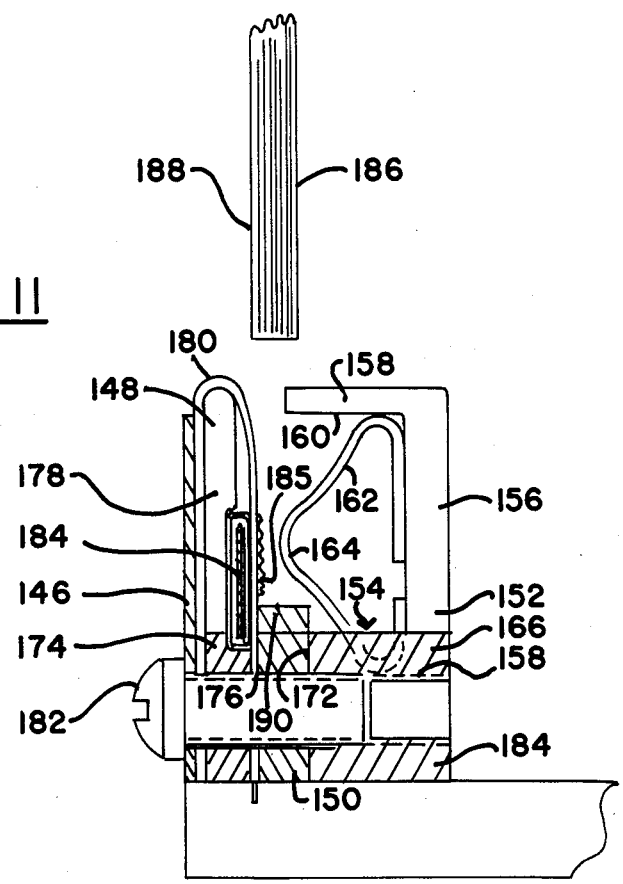

SELF-SOLDERING FLEXIBLE CIRCUIT CONNECTOR

BACKGROUND OF THE INVENTION

The present invention relates to flexible circuits and more particularly to flexible circuits and flexible circuit boards having an integral heater.

Flexible circuits are being employed increasingly to improve the architecture of modern high density electronic circuitry and in the form of ribbon conductors to interconnect parts movable with respect to one another. As complexity and thus density of packaging of circuits increases, the problems of miniautrizing interconnection devices without sacrificing reliability of the interconnection becomes increasingly difficult. As printed circuit boards and electrical connectors become smaller, the ability to securely grasp a connecting board or base member and to hold them in the face of vibration, expansion and contraction in the presence of heat and cold, creep and the like becomes a mechanical problem requiring in many instances rather elaborate, albeit quite small, mechanical devices which at best only mitigate the problems. Even so the connectors remain a size-bulk problem and securing them to delicate printed circuit boards is still another and even greater problem.

BRIEF DESCRIPTION OF THE PRESENT INVENTION

The present invention provides a connection technology capable of reuse if desired, that combines a high density capability, equivalent to that of an elastomeric connector, with the reliability of a solder joint. Specifically, self-regulating temperature controlled heaters on the order of as little as 0.030 inch thick are incorporated into flexible circuits over an area where solder connections between the flexible circuit and another circuit or component are to be made. The insulation over the conductors is removed on the side away from the heater and the exposed conductors are covered with solder or other conductive heat-activated material. Alternatively the exposed conductors are tinned and a reflowable solder pad on the board is employed; this combination being preferable in most high density uses.

The heaters are preferably of the type disclosed in U.S. Pat. No. 4,256,945, the disclosure of which is incorporated by reference. Such heaters employ a technique for temperature regulation based on a combination of alternating current skin effect, the Curie points of magnetic materials and a relatively constant current supply to cause the heater to maintain a constant temperature determined by the composition of the ferromagnetic material utilized. For the solder standardly used in electronic circuits the temperature of the heater typically could be approximately 265° C. A power supply suitable for such use is disclosed in U.S. patent application, Ser. No. 684,730, filed by Clappier et al filed on Dec. 21, 1984, and assigned to the assignee of the present invention; the disclosures of such invention being incorporated herein by reference.

The heater employed may also be of the various types disclosed in U.S. applications assigned to the assignee of the present invention; namely, Ser. No. 243,777 filed 3/16/81 now U.S. Pat. No. 4,701.587; Ser. No. 543,443 filed 10/25/83 now U.S. Pat. No. 4,695,713; Ser. No. 445,862 filed 12/1/82; and Ser. No. 586,712 filed 3/6/84 now U.S. Pat. No. 4,695,712. All of these heaters may be employed herein and the disclosures of the aforesaid applications are incorporated herein by reference.

The underlying theory in all of these heaters is that since the power delivered to the heater is $P = I^2 R$ and if the current is held relatively constant, then the energy dissipated is a function only of the thermal resistance of the heater. The heater resistance above Curie temperature is less than below as a result of the large reduction in skin effect which permits a large proportion of the current to spread out of the relatively high resistance ferromagnetic layer into a layer of lesser resistance or into a thicker layer thus reducing current density and thus resistance.

Flexible circuits with heaters as set forth herein are capable of use to connect pad and pin grid arrays to p.c. boards or the like and to connect, for instance, 166 conductors in a 8.4 inch wide circuit with conductors at 0.05 inch on centers to a p.c. board or substrate in a surface mount configuration.

The flexible circuit is used herein to interconnect printed circuit boards, leaded and leadless chip carriers to printed circuit boards and printed circuit boards or equivalent to multiple printed circuit boards. Further the flexible circuit may be employed in a U-shaped configuration in a daughter board support to contact exposed conductors on both sides of a daughter boards and contact conductors on a mother board all at the same time to provide various selectable interconnections.

In each of the uses of the invention, use is made of the advantages of the reliability, precise temperature control and relatively low temperature of the heaters, the solid connections provided by the solder and the flexibility of the circuits. Zero and low insertion force connectors are vastly improved since the solder imparts a very positive holding force at every contact point.

BRIEF DESCRIPTION OF THE DRAWINGS

FIG. 1 is a top view of a flexible circuit according to the present invention;

FIG. 1A is a top view of a variation of the heater outer structure of FIG. 1;

FIG. 2 is a side view of the circuit of FIG. 1;

FIG. 3 is a cross-sectional view of the heater of FIG. 1;

FIG. 4 is a detailed view of the heater contact structure;

FIG. 5 is a perspective view of the flexible circuit of the invention being soldered in place to a printed circuit board;

FIG. 5A is a side view in elevation of the combination of FIG. 5.

FIG. 6 is diagrammatic view of several uses of the flexible circuit of FIGS. 1-4;

FIG. 7 is a sectional view of a daughter board support incorporating the heater-flexible circuit arrangement of the present invention;

FIG. 8 is a perspective view of the device of FIG. 7;

FIG. 9 is a view in sections of a preferred form of heater;

FIG. 10 is a diagrammatic side view of a use of the heater of FIG. 9;

FIG. 11 is a side view of a pressure fit connector employing the present invention;

DETAILED DESCRIPTION OF THE INVENTION

Figure 12:
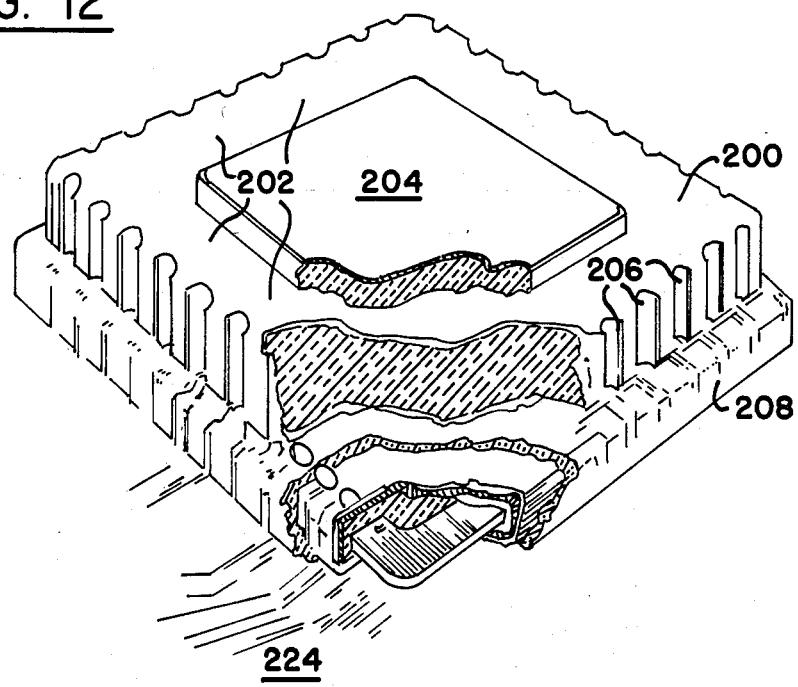
FIG. 12 is a perspective view of a flexible circuit of the present invention employed to connect a chip mounted on a leadless chip carrier to a printed circuit board.

Referring now specifically to FIGS. 1 and 2 of the accompanying drawings, there are illustrated two views of a flexible circuit with an integral heater. The flexible circuit, generally designated by the reference numeral 2, has embedded in an insulating flexible body 4, a plurality of conductors 6. The conductors 6 are illustrated for purposes of description only as a series of parallel conductors; it being understood that the array of conductors can conform to any desired pattern so long as they are arrayed in the region where connection to an external or internal circuit or connector is to be made in conformance with the circuit array of the external circuit or connector. This region is generally designated by the reference numeral 8.

In the region 8, the insulation covering the conductors 6 is removed and solder 10 or other heat activated conductive material is applied to the bared conductors 6. A heater 12 is located immediately over the region 8 of the flexible circuit, as viewed in FIG. 2, being located on the opposite side of the circuit from the bared conductors 6. The insulation 4 in this embodiment is brought over and extends beyond the heater; being sealed to the topside of the flexible circuit. Thus the heater is sealed to the circuit 2 over the exposed conductor and solder for heating the solder to its melt temperature and above to a desired extent.

Referring to FIG. 1A, an alternative layout of the heater structure is illustrated. A heater 5 is again laid over an end region of a flex circuit board 3 but instead of extending out of the edge of the flex circuit, it makes a 90° turn as at 7 and has a length 9 extending along a side edge of the circuit. Current contact areas 11 and 13 are provided and in this embodiment a grommet 15 is passed through the end of the heater remote from contact areas 11 and 13 to electrically connect the various layers together. Aligning holes 17 and 19 are provided in the board 3.

Referring to FIG. 3, the heater 6 is preferably a self-regulating heater. A self-regulating heater of the type which may be employed herein includes a conductor 14 surrounded by a thin layer 16 (0.002" for instance) of insulation 4. Surrounding the layer 16 is a layer 18 of ferromagnetic material about 1 to 1.8 skin depths thick, itself surrounded by a layer of copper 20. In its physical realization, the heater illustrated may be 0.030 inch thick, about 0.180 inch wide, 9 inches long and delivers about 250 watts of power at a temperature of 265° C.: about the temperature of a wave solder machine.

As disclosed in the cited patent, if the heater is connected across a source of constant current, the heater autoregulates at or approaching the Curie temperature of the ferromagnetic layer which in this application is, as indicated above, approximately 265° C. Connection to the heater 12 is made at location 22 of the heater (see FIG. 4) where the copper-ferromagnetic outer layers are removed to expose a region of the insulation 16 and a smaller region of the insulation is removed to expose the conductor 14. The copper-ferromagnetic layers 18–20 on the one hand and the return conductor 14 are connected together electrically at the end of the heater remote from the region 22; that is, at the left end of the heater as viewed in FIG. 1. Connection may be achieved simply by discontinuing the insulating layer 16 just short of the end of the heater remote from region 22 and this region is compressed so that the conductors are all in contact or the layers may be soldered together.

The heater 12 is illustrated as extending outwardly from the flexible circuit 2 but may well be terminated at the edge of the circuit 2 with the region 22 lying outwardly of the outermost conductor 6 or the heater contact area may extend up the side of the flexible circuit a short distance. See FIG. 1A.

Referring now to FIGS. 5 and 5A of the accompanying drawings, there is illustrated a view in perspective of the flexible circuit 2 of FIG. 1 in alignment with a printed circuit board 30 to which the circuit 2 is to be connected. To insure alignment of the circuit 2 and connector, the flex connector is provided with alignment holes 34 intended to mate with pins 32 on the printed circuit board 30.

To connect the flexible circuit 2 to the printed circuit board 30, the pins 32 are aligned with holes 34 and the two boards are pressed together while current is applied to the heater 33 through a hole 44 in the upper surface of the circuit as viewed in FIGS. 5 and 5A. One of the important advantages to the arrangement set forth herein is that the connections may be readily broken and remade a number of times thus greatly facilitating repair and maintenance. A solder reflow pad 35, described in more detail below, may also be employed.

Another advantage to this type of connection is the ability to connect the flexible circuit to two or more distinct circuit boards. Reference is made now to FIG. 6 of the accompanying drawings. A flexible circuit 50 is provided at its two ends with heater and bared conductor arrangements 52 and 54. The flexible circuit may next be soldered lead for lead to leads 56 and 58, respectively, on printed circuit boards 60 and 62. In such an arrangement a separate connector is not required since it is standard practice for printed circuit boards to terminate in parallel conductors for insertion into connectors. In such a case, alignment can be obtained by having studs protruding from the printed circuit board for insertion into mating holes in the flexible circuit, an alignment housing or in the case of a daughter board, slots within the flexible circuit for cooperation with the ridges in the daughter board. Since the flexible circuit is highly flexible, it may bend around the end of a daughter board such as at 64 and bend to a board at 90° such as board 68 thus adding greatly to the architectural freedom of the physical layout of a piece of equipment.

Referring now to FIGS. 7 and 8 of the accompanying drawings, the flexible circuit 50 of FIG. 6 may be employed in a still further environment. A printed circuit board 70 is to be connected to an interconnect board 72 via a zero insertion force connector 74. The body of the connector is composed of two side walls 76 and 78 and end walls 80 and 82. The walls are made preferably of a resilient material—METALOR polymer. The flexible circuit 50 forms a "U" that has its legs 84 and 86 secured in the side walls 76 and 78 and has its base 88 extending across the open bottom of the connector 74. There may be three different heaters employed in this embodiment; two bonded to the upper ends of the legs of the "U" exterior thereto. The heater 90 of the type described in FIG. 3 lies on top of apertured base 88 of the flexible circuit 50 and a resilient pad 92 is placed over the heater to hold it in position, to cushion the printed circuit board, and to provide mechanical compliance.

In this embodiment, the board 70 has independent circuits on both its faces and each such circuit is to be connected independently to one or more circuits which may reside on the other side of the board 70 or on the interconnect board 72. Connections between the two sides of the board are made by having the insulation removed from the two ends of the same conductor of the flexible circuit while connection from one side or the other of the board 70 to the board 72 is made by having an exposed conductor with solder along the base 88 of the "U" which connects to the printed circuit board through the apertured base of the connectors. Thus by simply selecting beforehand, the areas of the conductors of the flexible circuit that are to be exposed, quite complex interconnection arrangements between multiple circuits are possible in addition to the primary printed circuit board-to-board connections.

In an example of various possible interconnections, the flexible circuit may interconnect a conductor 94 on the left side of the board 70 to conductor 96 on the right side of the board 70, this approach being particularly useful with metal core boards where through-holes cannot be used. Continuing, a conductor 98 on the left side of the board 70 may be connected to a conductor 100 on the interconnect board 72 and a conductor 102 on the right side of board 70 to a conductor 104 on the board 72, all as viewed in FIG. 7. Power connections with the heaters may be made at the locations 106, 108, and 110 of FIG. 8.

The scale of the drawings is not intended to be accurate, for example, the spacings between contacts on many of these types of contact structures is much closer than illustrated, the structures of FIG. 1 and 7, for instance, having spacings of the order of only several mils to a hundred mils. The conductors of the flexible structures can be as fine as those of the connectors or in some instances one conductor of a flexible circuit may bridge several conductors of a daughter board to assure contact, thereby reducing the required accuracy of the aligning structures. Alternatively, a contact of the flexible circuit may be made long enough to bridge two contacts of 40 the board 70, for instance contacts 94 and 98 of FIG. 7 or the contacts on the flex-print can be staggered as at 50 so that a larger contact area can be provided for each fineline trace. In a typical example, a 166 line 8.4 inch wide flexible circuit has 0.05 inch between centers of 5 conductors, i.e. 50 mils. Thus a very low profile, ZIF, highly vibration resistant connector is provided particularly as seen in FIG. 5.

Referring now to FIG. 9 of the accompanying drawings there is illustrated a form of heater that may be employed as the heater 90 of FIG. 7. (Also see FIG. 18). The heater 90 illustrated in FIG. 9 comprises a conductor 112, a layer 114 of insulation (Polyimide), overlapped across the entire top of the conductor 112 as viewed in FIG. 9. The insulator is bonded onto the conductor with a suitable adhesive. The structure is enclosed by an outer layer 116 of copper having an inner lining 118 of ferromagnetic material. The copper layer 116 is overlapped but does not require bonding since it will hold its bends.

The heater of FIG. 9 may also be employed in the arrangement of FIG. 10 which diagrammatically illustrates a different physical arrangement employing the heater and a flexible circuit. Flexible circuit 120 is to be joined to a printed circuit board 122 having contacts 124, only one of which is illustrated. The arrangement is similar to a large clothes pin and employs a U-shaped spring clip 128 having a first leg 130 secured to a first finger engageable member 132. A second leg 134 of the spring clip 128 has the flexible circuit 120 bonded to an upper surface thereof as viewed in FIG. 10, the flexible circuit being folded over the end of leg 134 and extending under the leg. A heater 136 is laminated into the flexible circuit and lies under the leg 134 and this assembly is situated such as to be in contact with the printed circuit board 122. An L-shaped aligning pin 138 has its long leg secured to the top surface as viewed in FIG. 10, of the flexible circuit and its short leg 140 extending into an alignment hole 142 in the printed circuit board.

By squeezing the member 132 and 138 together, the leg 140 is raised and the structure may be applied to or, if already applied to, withdrawn from the printed circuit board 122. Thus the mechanism that provided the application and removal tool also provides alignment of the two members.

Referring now specifically to FIG. 11 of the accompanying drawings, there is illustrated in vertical section of still another connector for printed circuit boards. This connector is a force fit type providing wiping of the contact areas upon insertion and withdrawal of the board. This drawing illustrates only the single heater case; the connector can have coplaner connection heaters as well as heaters and circuits on both sides of the board. A connector housing 144 is composed of four main parts, a flexible circuit clamp 146, a two-part flexible circuit containment member 148 and 150 and a main connector shell 152. The shell 152 has an elongated base 154 having an upside down L-shaped member 156 extending upwardly from the right edge thereof, as viewed in FIG. 11. The base extends to the left of the L-shaped member 156 to provide a surface 158 parallel to and spaced from lower surface of base 160 of the L-shaped member 156. A generally triangular spring 163 is positioned between surfaces 158 and 160 and has a generally rounded apex 164 directed toward the left in FIG. 11 and located about halfway between surfaces 158 and 160. The spring 162 is elongated in the direction parallel to the elongated dimension of the base and is retained between side walls 166, only one of which is illustrated in FIG. 11.

The two-part flexible circuit containment plates 148 and 150, have the part 150 abutting against left vertical surface 172 and coextensive with said surface. The plate 148 has a lower region 274 juxtaposed to and having a vertical surface 176 coextensive with surface 172 of member 150. Upper region 178 of member 148 defines a space between flexible circuit clamp 146 in which a flexible circuit 180 is clamped between members 146 and 178, comes over the top of the containment plate 148 at above the level of the base 158 of the L-shaped member 156, and then descends in open space opposite the apex 164 of the spring 162, subsequently passing between members 248 and 150 and out of the connector. The structure is held together by bolts 182 at opposite ends of the base 154; the bolts passing in sequence through members 146, 148, 150 and into the base 154. The flexible circuit alignment plate 148 is recessed opposite the apex 164 of spring 162 and somewhat downward thereof to receive heater 184 which may be separate from and bonded to or laminated in the flexible circuit 180. The flexible circuit 180 has the insulation removed in region 185 opposite the apex of the spring 162 and has solder applied thereto.

In use, a daughter board 186 is inserted by pressing it downwardly between the spring 162 and the flexible circuit 180. The spring causes the board contact area 188 to be forced against region 185 of the flexible circuit as it is inserted thereby wiping the contact areas. The board comes to rest on the surface 190 of a shelf of the member 150 which extends between side walls 166 and serves as an alignment member of the connector together with side walls not illustrated. The heater may now be energized to solder together the contact areas of the board and flexible circuit.

Another embodiment of the invention is intended to overcome a major problem encountered in placing leadless chip carriers on printed circuit boards. Due to different coefficients of thermal expansion and residual strains remaining after soldering a chip carrier to a board, solder joints fail and very expensive integrated circuits and/or boards may be lost. In addition, these devices often have a high failure rate and a connector such as disclosed herein that permits components to be readily removed and replaced is highly desirable. Referring specifically to FIG. 12 of the accompanying drawings, there is illustrated a connector structure for relieving such problems.

A ceramic carrier 200 with leads 202 folded thereon, has a chip 204 secured thereto in a conventional manner. The ceramic carrier has in its preferred embodiment as illustrated, a series of vertical, as viewed in FIG. 12, castellations 206 formed therein. Each castellation 206 or other connection, intercepts a different lead 202 or leads and is filled with solder gold or gold alloys for use at braze temperatures.

Figure 13:
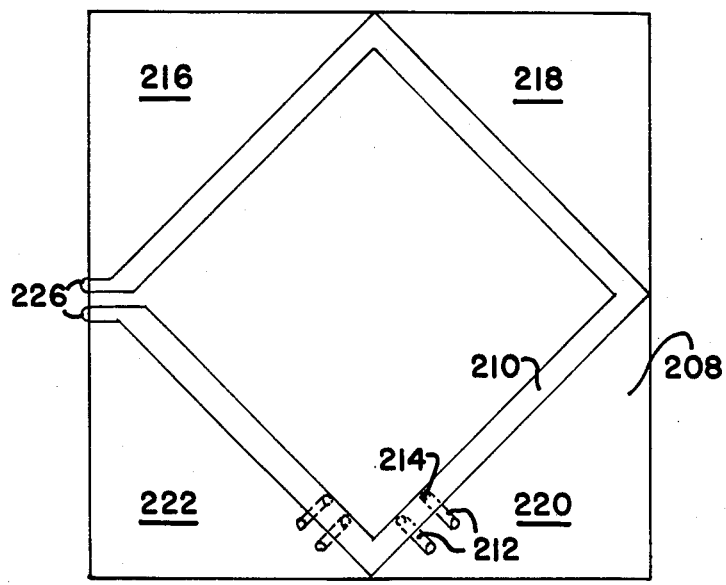
FIG. 13 is a top view of the flexible circuit and heater arrangement of FIG. 12, partially assembled.

Located between the ceramic chip carrier 200 and a printed circuit board or other appropriate circuit or circuit carrier, is a flexible circuit according to the present invention. The use of the flexible circuit permits the assembly to "move" with stress and temperature changes and thus greatly reduces failures in the solder due to cold working. Specifically, flexible circuit 208 and reference is made to FIG. 13 of the accompanying drawings, is of the same shape (square, rectangle, etc.) as the leadless chip carrier; a square as illustrated in FIG. 13. A square heater 210 having its edges lying at 45° to the edges of the flexible circuit, lies within the confines of the flexible circuit and intercepts the edges of the latter at their mid points. The flexible circuit has a plurality of conductors 212 which are exposed where these align with the conductors or the board to which the chip is to be connected; at terminals 14. The conductors are long enough to extend from terminals 214 lying under the heater, as illustrated in FIG. 13; such that when the flexible circuit is folded to cause the apices of the four triangles 216, 218, 220, 222 meet in the center; the conductors extend up along the edge of heater 210 and over the top of the heater and into alignment with the castellations or pad 206; the latter as seen in FIG. 12. The pattern of conductors illustrated in FIG. 13 is not the only pattern that can be employed, the pattern of conductors for contact with a printed circuit board 224 or appropriate circuit, being determined by the pattern of conductors on the latter board to be contacted by the flexible circuit.

Figure 14:
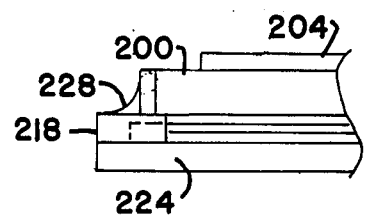
FIG. 14 is a cross-sectional view in elevation of the structure of FIG. 12.

In use, the flexible circuit which has solder or conductive adhesive applied to the exposed flexible circuit conductors, and laid on the printed circuit board, the leadless chip carrier is placed on the flexible circuit and the heater 208 is energized by applying a constant alternating current to terminals 226 of the heater 208. Both sets of contacts are soldered together concurrently or separately, if desired with the flexible circuit connecting the printed circuit board and the chip carrier. If desired, the flexible circuit may be cut away in the region defined within the confines of the heater so that the carrier 200 can be bonded to the board by epoxy or other suitable binder. In addition to the advantages achieved by the use of the flexible circuit, strength is added to the structure by the fillets of solder 228, see FIG. 14, formed at the junction of the flexible circuit and the carrier; which fillets in conjunction with the circuit traces in the flexible circuit and the solder in the castellations provide a long thin well-supported beam of solder and copper of relatively high strength, thus greatly increasing the ability of the system to tolerate the different coefficients of thermal expansion of the various elements of the system. Conductive adhesive which may be thermally actuated may also be employed in the castellations with perhaps some loss of strength in the beam.

Figure 15:
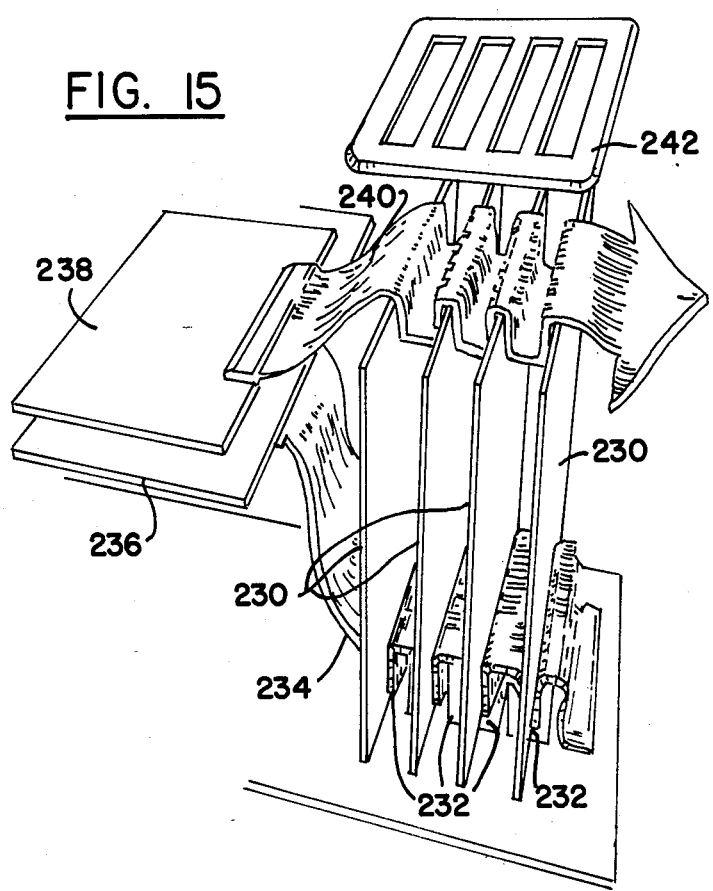
FIG. 15 is a perspective view of a flexible circuit employed to connect multiple daughter boards.

Due to the great flexibility of flexible circuits, an arrangement such as illustrated in FIG. 15 is possible. In such a structure a plurality of vertical, as viewed in the Fig., printed circuit boards 230 are held in an upright position by holders 232. A flexible circuit 234 extends from a printed circuit board 236 into each holder 232 passing between the sides and bottom of the holders and the sides and bottom of the boards adjacent a terminal end of each of the boards 230. The holders 232 and 242, or the flexible circuits 234 may have the heaters formed therein depending upon preferance. In each location where a connection is to be made the flex circuit conductor is bared. It should be noted that the term flexible circuit as used herein is not limited to circuits as such but also includes flat cable, multiconductor flexible conductor straps such as used to connect to the movable heads of dot matrix printers and the print control circuits and the like.

Figure 16:
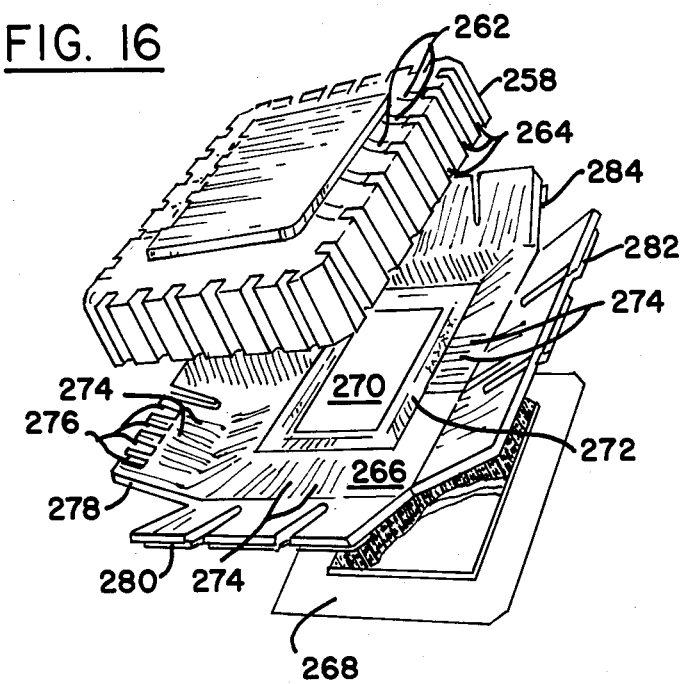
FIG. 16 is a perspective view of a modification of the structure of FIG. 12.

Referring specifically to FIG. 16, there is illustrated a modification of the structure of FIG. 12. A ceramic chip carrier 258 has a chip 260 attached thereto. Conductors 262 extend from chip contacts to solder filled castellations 264.

A flexible circuit 266 is secured to a printed circuit board 268 and to the chip carier 258 by a heat activated adhesive. The flexible circuit has a centrally located heater 270 and adhesive is applied to both its upper and lower surfaces as illustrated in FIG. 16 so that when set on the board 268 and the ceramic is set on the flexible circuit, the heater is energized, the adhesive is activated and the elements are mechanically thermally joined.

The flexible circuit 266 has a second heater 272 which surrounds the heater 270 and is disposed over the bared and tinned ends not illustrated of conductors 274, facing the printed circuit boards 268. Upon energization of the heater 272 the ends of the conductors 274 are soldered to mating conductors on the printed circuit board 268.

The flexible circuit 266 is folded up along the edges of the chip carrier 258 so that tinned ends 276 of conductors 274 are brought into contact with the solder in the castellations 264. A heater is provided behind each group of contacts 267, these being designated by numerals 278, 280, 282 and 284. When energized the heaters cause the ends 276 of conductors 274 to be soldered to the chip carrier so that a circuit for each lead 267 is completed through the solder of castellation 264, conductors 274 and through the terminals under heater 272 to the printed circuit board 268.

Figure 17:
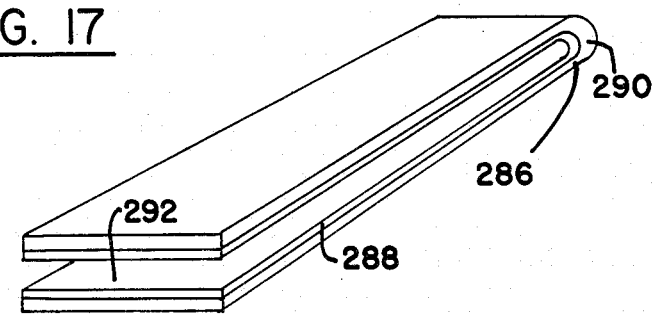
FIG. 17 is a perspective view of an alternative form of heater for use with the flexible circuits of the present invention.

The heater has been illustrated in two different forms in FIGS. 3 and 9. Another version of the heater is illustrated in FIG. 17 of the accompanying drawings. A flat copper bar 286, quite long but quite narrow, is coated on one surface with a layer of ferromagnetic material 288. The copper bar is folded in half at 290 through a 180° angle so that the two halves of the bar are parallel to one another. An insulation layer 292 is disposed between the now juxtaposed regions of the ferromagnetic layer 288.

This heater is quite thin and very effective; being of the order of 0.016 inch thick.

Figure 19:
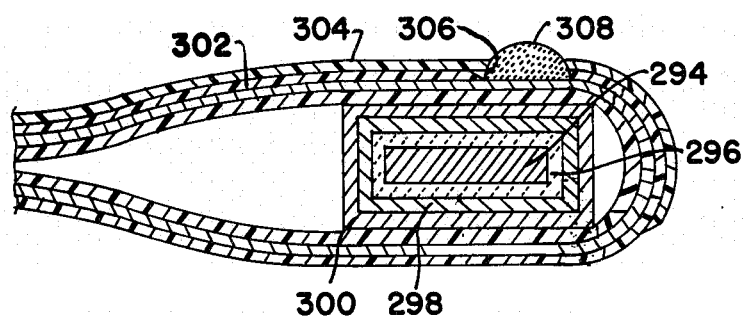
FIG. 19 is a sectional view of the device of FIG. 18.
Figure 18:
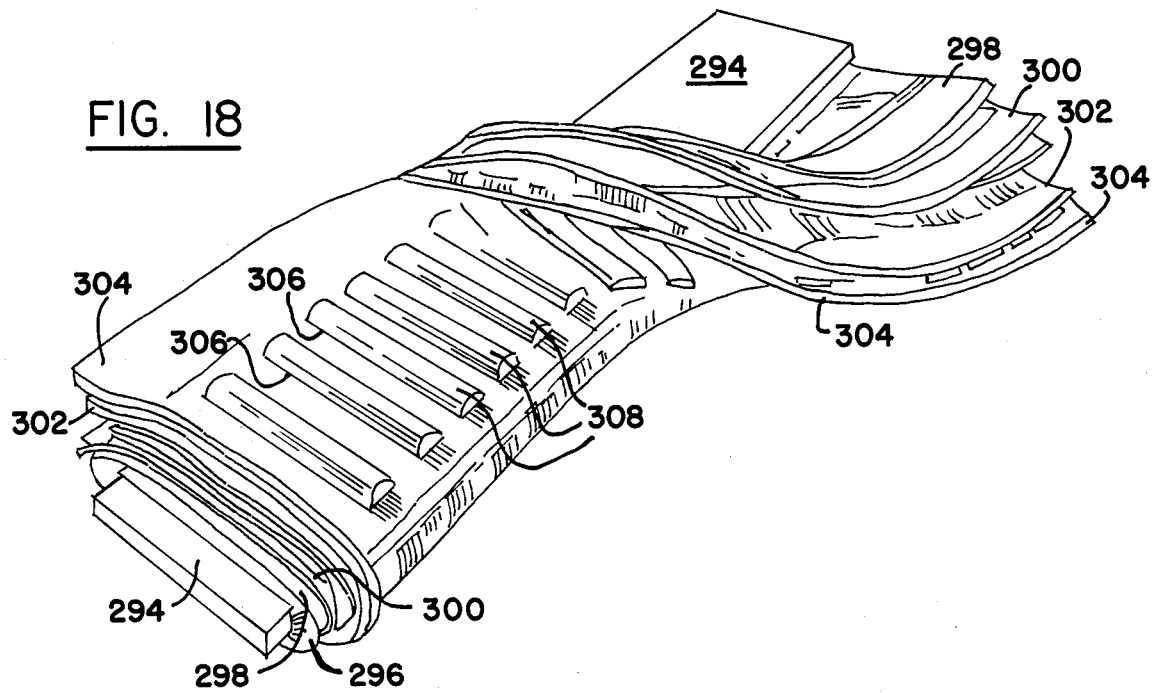
FIG. 18 is a perspective view of a structure according to the present invention employing a solder reflow pad and with the addition of an elastomeric compliant insulation layer.

When soldering to very closely spaced leads, as small as 0.006 inch on centers, a solder reflow pad may be required. Referring specifically to FIGS. 18 and 19 of the accompanying drawings, a heater, flexible circuit and reflow pad arrangement is illustrated. The heater consists of buss 294, insulation layer 296, ferromagnetic layer 298 and outer copper layer 300. Flexible circuit 302 is folded around the heater and a solder reflow layer 304 overlies the exposed conductors of the flexible circuit. The solder reflow layer, which is secured to the flexible circuit in the region of the exposed conductor, is an insulating layer with windows 306 filled with solder 308. The spacing between windows corresponds to the spacing between conductors of the flexible circuit. The windows in the reflow layer confine the solder to the metal conductors and prevents short circuiting of the conductors. The reflow layer may alternatively be composed of two layers of insulating material with aligned windows with a continuous strip of solder inbetween to the same. Either arrangement is acceptable. In cases where the surface is not regular a smooth elastomeric layer may be added for compliance and to maintain a relatively constant normal force across the contact area.

Some of the advantages of the flexible board concepts of the invention now become readily apparent. The connection arrangment provides an unusually low profile; the contacts are, in effect, a self soldering; very fine trace spacing, as little as 0.006", is currently possible; the heater is fully shielded and there are no long term creep problems, no contact resistance changes and no problems resulting from vibration; these features all being due to the self soldering capability of the flexible circuit. When using spacings of as little as 0.006", a reflow solder pad, such as illustrated in FIG. 18 is preferably employed.

Another interesting advantage of the use of flexible circuit with heater relates to avoiding corrosion and/or oxidation of the exposed solder and contacts during shipping and storage of the circuits. As a result of the availability of a heat source applying heat uniformly to all solder-conductor regions, the circuit may be bonded to a metallic plate for storage and shipping, thus excluding air and moisture from contact areas. When it is desired to use the circuit, the heater is energized so that the board can be removed from the metallic plate, leaving clean exposed solder surfaces.

Although reference is made throughout to solder as the heat sensitive bonding material, other heat sensitive, conductive, bonding materials may be employed. Such other materials may include conductive thermosets, thermoplastics and the term "solder" includes liquid solders, gold and silver solders, all of which may be employed in various of the embodiments.

The term "constant current" as employed herein does not mean a current that cannot increase but means a current that obeys the following formula:

$$(dI/I) > -\tfrac{1}{2}(dR/R). \tag{1}$$

Specifically, in order to autoregulate, the power delivered to the load when the heater exceeds Curie temperature, must be less than the power delivered to the load below Curie temperature. If the current is held invariable, then the best autoregulating ratio is achieved short of controlling the power supply to reduce current. So long, however, that the current is reduced sufficiently to reduce heating, autoregulation is achieved. Thus when large autoregulating ratios are not required, constraints on the degree of current control may be relaxed thus reducing the cost of the power supply.

The above equation is derived by analyzing the equation:

$$P = (I + \Delta I)^2 (R + \Delta R)$$

where P is power. Differentiating P with respect to R $$(dP/dR) = I^2 + 2RI (dI/dR)$$

and to satisfy the requirements for autoregulations $dP/dR > 0$. Thus, $I^2 + 2RI (dI/dR) > 0$ which reduces to Equation 1 above.

Other improvements, modifications and embodiments will become apparent to one or ordinary skill in the art upon review of this disclosure. Such improvements, modifications, and embodiments are considered to be within the scope of this invention as defined by the following claims:

I claim:

1. In combination
   a flexible circuit having at least one conductor disposed in and surrounded by insulating material covering said conductor,
   said material having large opposed surfaces,
   a heater disposed along and in contact with one of said surfaces to heat a limited region of said conductor,
   said at least one conductor having the insulating material removed along the other of said opposed surfaces opposite the limited region of said conductor to be heated,
   said heater including means for connection to a source of energy.

2. A combination according to claim 1 wherein said opposed surface of said conductor is contacted with by solder.

3. A combination according to claim 2 wherein
   said flexible circuit has a plurality of conductors have limited regions and at least several of said conductors exposed in a predetermined array overlying said heater.

4. A combination according to claim 3 further including
- a solder reflow pad of insulating material overlying exposed regions of said conductors,
- said solder reflow pad having solder filled windows in alignment with said exposed limited regions.

5. A combination according to claim 4 wherein said reflow pad has a compliant insulating layer generally coextensive with said pad.

6. A combination according to claim 3 wherein said heater is a heater that upon application of a constant alternating current is temperature self regulating.

7. A combination according to claim 2 or claim 6 wherein said heater is enclosed between one part of said
- flexible circuit and a folded over part of said flexible circuit.

8. A combination according to claim 1 wherein said heater is of the order of 0.030 inch thick.

9. A combination according to claim 3 or claim 6 further including an electrical circuit having a pattern of exposed conductors generally a same as the pattern of limited exposed regions of said conductors region of said flexible circuit, and
- means for aligning said patterns of conductors.

10. A combination according to claim 9 further comprising a plurality of said electric circuits,
- said flexible circuit having a plurality of limited regions of exposed surfaces of said conductors, and
- means for engaging each of said regions of exposed conductors with a different one of said limited electrical circuits.

11. A combination according to claim 3 or claim 6 further comprising
- an electrical connector having a plurality of alternating layers of insulating material and conductive material,
- said limited regions of exposed conductors of said flexible circuit having a spacing and pattern corresponding to said conductive layers, and
- means for placing said limited regions of exposed conductors in alignment and contact with said layers of conductive material.

12. A combination according to claim 3 or claim 6 further comprising
- a printed circuit board having an array of exposed contacts conforming generally to the geometry of the array overlying said heater,
- a clothes-pin like member having a pair of elongated legs terminating at one end in opposed jaws having a pair of pins located adjacent the two ends of one of said jaws and extending toward the other of said jaws,
- said flexible circuit secured to a surface of one of said elongated legs facing the other of said legs,
- registration holes in said flexible circuit and said printed circuit board arranged such that when said holes are aligned said arrays are aligned with said pins positioned to pass through said holes upon alignment.

13. A connection arrangement comprising
- a flexible circuit having a plurality of flexible conductors disposed in and surrounded by flexible insulating material covering said conductors.
- said insulating material having large opposed surfaces,
- a heater disposed along and in contact with one of said surfaces to heat a limited region of some of said conductors,
- some of said conductors having the insulating material removed along the other of said opposed surfaces to expose said limited region of some of said conductors in a specific array,
- said heater including means for connection to a source of energy,
- said heater fixed in position relative to said flexible circuit to heat said limited regions,
- a connector having an opening permitting insertion of an electrical circuit between and in contact with said limited region of at least one of said conductors, and
- means causing terminals on the electrical circuit to be aligned with said at least limited region of at least one of the exposed conductors of said flexible circuit.

14. A connection arrangement according to claim 13 wherein
- a limited region of exposed conductor is adapted to be aligned with conductors of a further electrical circuit.

15. A connection arrangement according to claim 14 further comprising
- a third limited region of exposed conductors on said flexible circuit, and
- a heater associated with said third region of exposed conductors.

16. A connection arrangement according to claim 15 wherein said third region lies along the base of the U-shaped connector.

17. A connection arrangement according to claim 13 further comprising
- a third limited region of exposed conductors on said flexible circuit.

18. A connection arrangement according to claim 17 wherein
- said third limited region of exposed conductors are adapted to be aligned with further conductors of the first-mentioned electrical circuit.

19. A connection arrangement according to claim 18 wherein
- said connector is U-shaped and wherein one of said limited regions of exposed conductors lies along one of the legs of said U-shaped connector.

20. A connection arrangement according to claim 18 wherein
- the second limited region of exposed conductors lies along the other leg of said U-shaped connector.

21. A connection arrangement according to claim 13, comprising
- a spring,
- said limited region of at least one of said conductors disposed in alignment with and spaced from said spring, and
- means permitting insertion of an electrical circuit between said limited region of exposed conductors and said such that said spring biases said electrical circuit into contact with said at least one limited region of exposed conductors, and
- means for providing alignment between exposed conductors of said flexible circuit with exposed conductors of the electrical circuit.

22. A connection arrangement comprising
- a flexible circuit having a plurality of flexible conductors disposed in and surrounded by flexible insulating material covering said conductors,
- said insulating material having large opposed surfaces, a heater disposed along and in contact with one of said surfaces to heat a limited region of some of said conductors, some of said conductors having the insulating material removed along the other of said opposed surfaces to expose said limited region of some of said conductors in a specific array, said heater including means for connection to a source of energy, said heater fixed in position relative to said flexible circuit to heat said limited regions, a circuit component having contacts disposed in a predetermined array corresponding at least in part to the specific array of said limited regions, and in contact with exposed limited regions of said conductors, and said arrays being bonded one to the other.

23. A connection arrangement according to claim 22 further comprising a block of insulating material having top and bottom surfaces and edge surfaces, at least one edge of said block having a further conductor extending thereon between said top and bottom surfaces, said circuit component having an electrical contact bonded to said further conductor, and one of said limited regions of one of said conductors being bonded to said further conductor at a location remote from said circuit member.

24. A circuit array according to claim 23 further comprising an electrically conductive contact one of said limited regions of said conductors of said flexible circuit having a further limited region of exposed conductor remote from the aforesaid limited region, a heater disposed on said flexible circuit on the surface thereof opposite said further exposed surface, said further exposed surface being bonded in electrical contact with said conductive contact.

25. The combination according to claim 23 wherein said further conductor is a heat bondable conductive material.

26. A connection arrangement according to claim 23 wherein said block has a castellation formed therein extending between said top and bottom surfaces, said further conductor disposed in said castellation.

27. A circuit array according to claim 26 wherein said block has a plurality of castellations in more than one of its edge surfaces;

said castellations at least partially filled with said conductive material, said flexible circuit has a plurality of exposed regions of said conductors, and at least some of said exposed regions of said conductors of said flexible circuit contact and are bonded to said material lying between said top and bottom surfaces.

28. A circuit array according to claim 27 wherein said flexible circuit has a second array of exposed conductors remote from said first mentioned array, a selfregulating heater associated with said second array a circuit member having electrically conductive contacts, at least some of said second array of exposed conductors of said flexible circuit being in contact with at least some of said conductors of said circuit member.

29. A flexible circuit with heater comprising a generally rectangular flexible circuit having conductors, a flat narrow heater strip formed to define the four sides of a generally rectangular shape, and employed to heat conductors of said flexible circuit, said flexible circuit folded over said heater such that the corners of said flexible circuit all approach each other on one side of said heater.

30. A flexible circuit with heater according to claim 29 wherein at least some of the conductors of said flexible circuit are exposed on a side of said flexible circuit opposed to the surface contacting said heater.

31. A circuit array comprising a flexible circuit having a plurality of conductors disposed in and surrounded by insulating material covering said conductors, at least one said conductors having the insulating material removed therefrom to expose a region of said conductor, a block of insulating material having top and bottom surfaces and edge surfaces, at least one edge surface of said block having a further conductor extending thereon between said top and bottom surfaces, a circuit member having an electrical contact bonded to said further conductor, and said exposed region of said one of said conductors of said flexible circuit being bonded to said further conductor at a location remote from said circuit member.

* * * * *